United States Patent
Liu et al.

(10) Patent No.: US 9,607,586 B2
(45) Date of Patent: Mar. 28, 2017

(54) ASYMMETRIC CIRCUITRY

(71) Applicant: Apple Inc., Cupertino, CA (US)

(72) Inventors: Michael L. Liu, Cupertino, CA (US); Liang Deng, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 385 days.

(21) Appl. No.: 14/183,321

(22) Filed: Feb. 18, 2014

(65) Prior Publication Data

US 2015/0235634 A1    Aug. 20, 2015

(51) Int. Cl.
*G09G 5/395* (2006.01)
*H03K 19/00* (2006.01)
*G06F 7/533* (2006.01)
*H03K 19/173* (2006.01)

(52) U.S. Cl.
CPC ............ *G09G 5/395* (2013.01); *G06F 7/533* (2013.01); *H03K 19/0013* (2013.01); *H03K 19/1737* (2013.01)

(58) Field of Classification Search
CPC .......... G06F 7/533; G06F 7/536; G06F 7/538; H03K 19/0013; H03K 19/0021
See application file for complete search history.

(56) References Cited

U.S. PATENT DOCUMENTS

| | | | |
|---|---|---|---|
| 5,070,471 A | 12/1991 | Dao-Trong et al. | |
| 5,144,576 A | 9/1992 | Briggs et al. | |
| 5,220,525 A * | 6/1993 | Anderson | G06F 7/5338 708/631 |
| 5,333,119 A * | 7/1994 | Raatz | H03H 17/0225 708/319 |
| 5,748,517 A * | 5/1998 | Miyoshi | G06F 7/5338 708/628 |
| 7,840,628 B2 | 11/2010 | Kurd | |
| 2003/0158880 A1 * | 8/2003 | Ng | G06F 7/5338 708/628 |
| 2004/0128338 A1 | 7/2004 | Even et al. | |

* cited by examiner

*Primary Examiner* — Chuong D Ngo

(74) *Attorney, Agent, or Firm* — Meyertons, Hood, Kivlin, Kowert & Goetzel, P.C.; Michael B. Davis

(57) ABSTRACT

Techniques are disclosed relating to asymmetric circuits. In some embodiments, a storage element is configured to maintain a first input value as an input to an asymmetric circuit during a time interval. For example, in one embodiment, the time interval may correspond to a frame of video data and the storage element may be configured to store a filter coefficient for the frame of video data. In some embodiments, the storage element may be configured to store the value as a constant for multiple operations by the asymmetric circuit. In some embodiments, the asymmetric circuit is configured to generate a plurality of output values based on the first input value and respective ones of a set of second input values. In some embodiments, the asymmetric circuit is leakage power asymmetric and/or critical path asymmetric. This may increase performance and/or reduce power consumption.

18 Claims, 8 Drawing Sheets

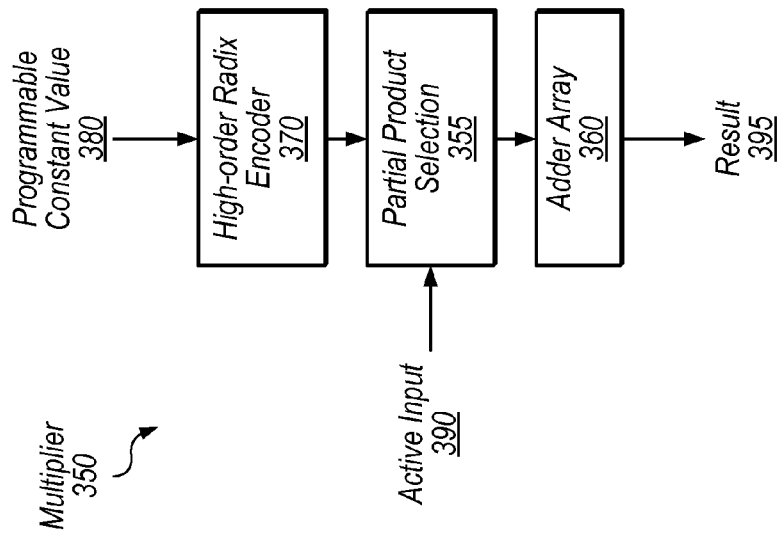
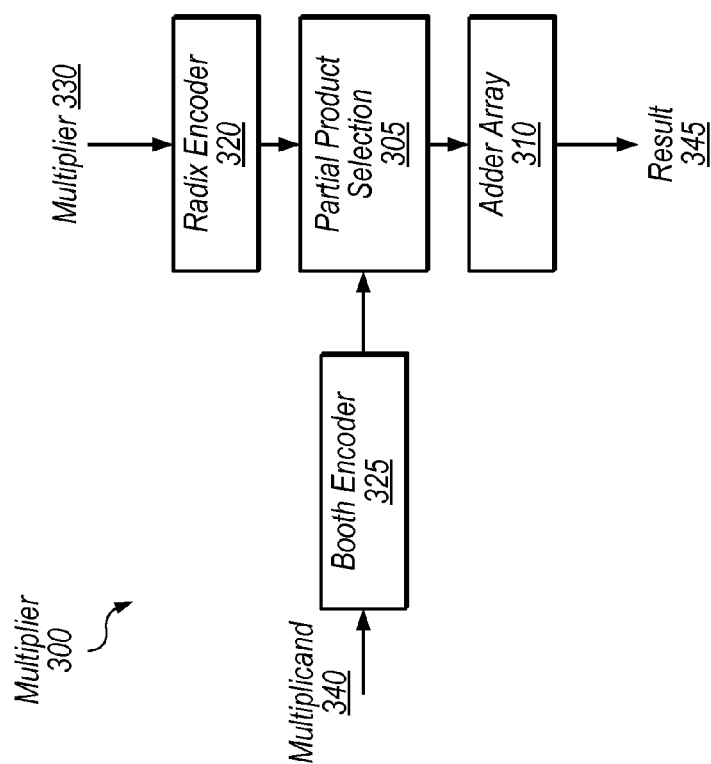
FIG. 3B
FIG. 3A

US 9,607,586 B2

ASYMMETRIC CIRCUITRY

BACKGROUND

Technical Field

This disclosure relates generally to computer processing and more specifically to asymmetric circuits.

Description of the Related Art

Software registers are used in various contexts to store values for relatively long periods of time, including: handling different use cases, working around bugs, storing parameters for processing large amounts of data, etc. In digital signal processing, coefficients are often stored in software registers and can be used to fine tune filter behavior. Similar parameters are also used in wireless communications and other applications.

Often, parameters or coefficients stored in registers do not change (or are not allowed to change) for a known period of time (e.g., a frame of video data). Thus, the register values may remain fixed over many computations. For example, a register may store a coefficient to be used for millions of samples before the coefficient changes.

SUMMARY

Techniques are disclosed relating to asymmetric circuits.

In some embodiments, a storage element is configured to maintain a first input value as an input to an asymmetric circuit during a time interval. For example, in one embodiment, the time interval may correspond to a frame of video data and the storage element may be configured to store a filter coefficient for the frame of video data. In some embodiments, the storage element may be configured to store the value as a constant for multiple operations by the asymmetric circuit. In some embodiments, the asymmetric circuit is configured to generate a plurality of output values based on the first input value and respective ones of a set of second input values.

In some embodiments, the asymmetric circuit is leakage power asymmetric and/or critical path asymmetric. This may increase performance and/or reduce power consumption in contexts in which an input to the asymmetric circuit is constant over a time interval.

In some embodiments, a multiplier circuit is configured to encode an input using high-order encoding such as radix-8 or higher encoding, for example. In some embodiments, the circuitry is configured such that the encoding lowers the toggle activity of the circuit, which may reduce dynamic power consumption. In some embodiments, another active input to the multiplier is not encoded at all, which may reduce the critical path for this active input.

In some embodiments, an exclusive-or circuit is configured to drive a smaller number of transistors with an active input than the number of transistors driven by a programmable constant input. This may reduce the critical path and reduce dynamic power consumption. In some embodiments, one or more transistors driven by the programmable constant input are low-leakage transistors.

In some embodiments, a multiplexer is configured to encode a select signal. In one embodiment, the encoding is one-hot encoding. This may reduce overall power consumption by the multiplexer and may reduce a critical path for inputs to the multiplexer.

BRIEF DESCRIPTION OF THE DRAWINGS

FIGS. 3A-3B are block diagrams illustrating exemplary embodiments of multiplier circuits.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Further, as used herein, the terms "first," "second," "third," etc. do not necessarily imply an ordering (e.g., temporal) between elements. For example, a reference to a "first" number of clock edges and a "second" number of clock edges may refer to any two different numbers of clock edges. In short, references such as "first," "second," etc. are used as labels for ease of reference in the description and the appended claims.

Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112(f) for that unit/circuit/component.

DETAILED DESCRIPTION

Figure 1:
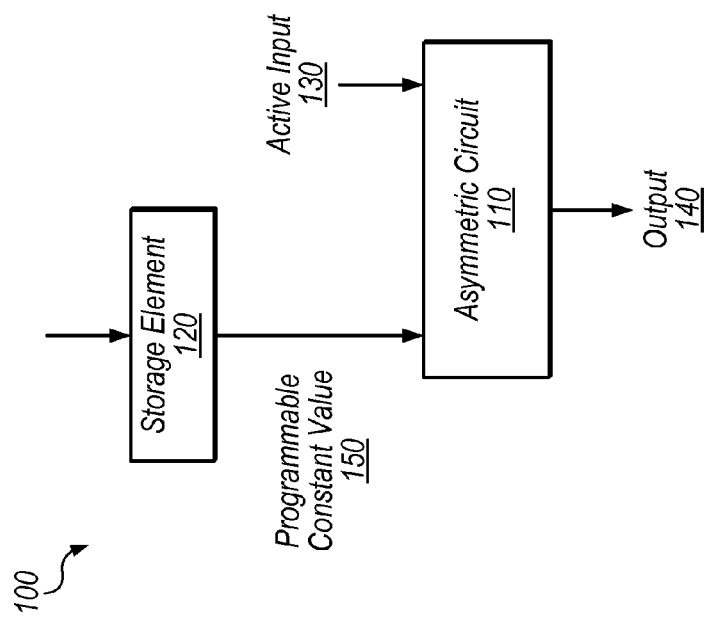
FIG. 1 is a block diagram illustrating one embodiment of an asymmetric circuit.
Figure 2:
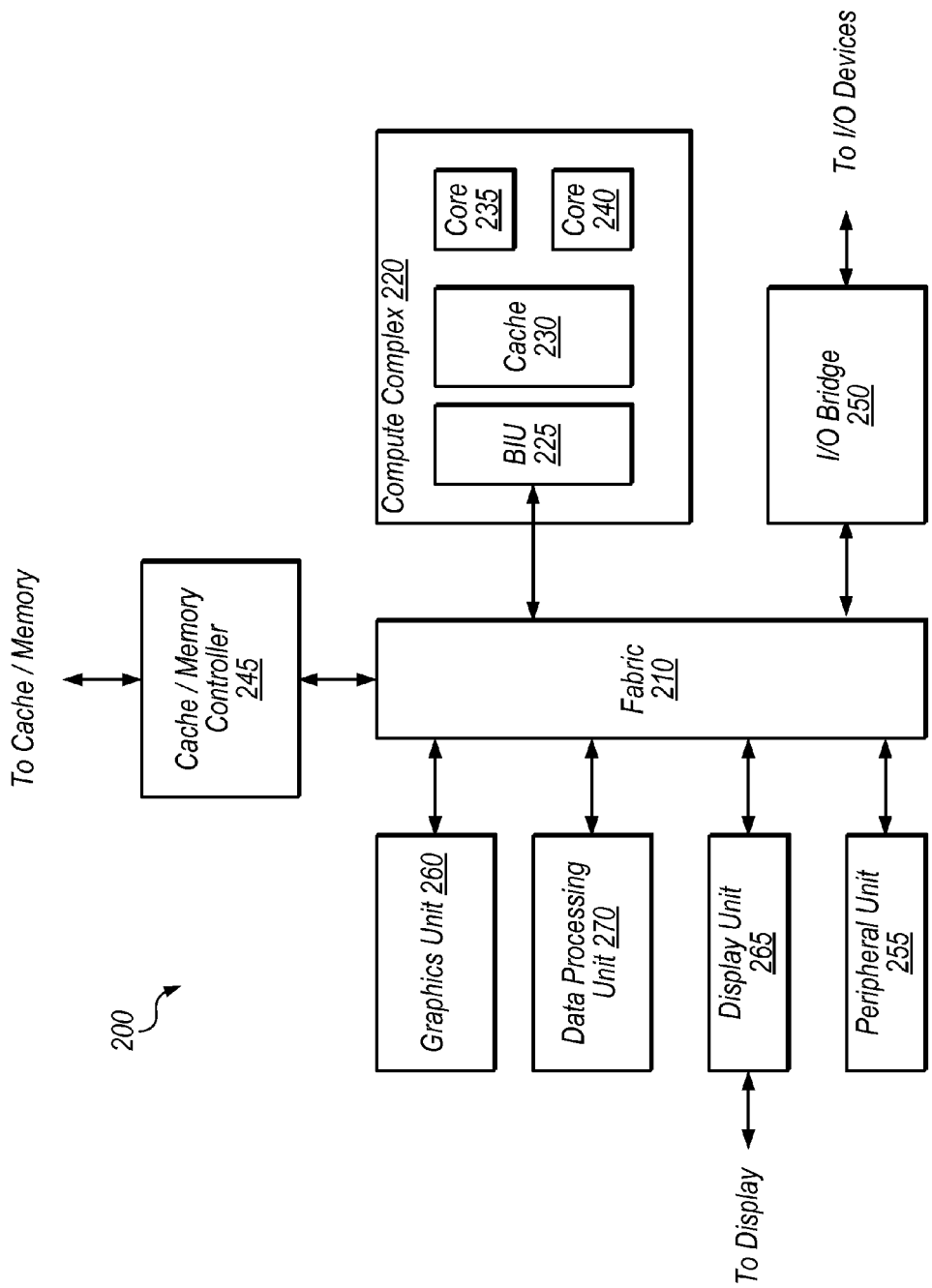
FIG. 2 is a block diagram illustrating one embodiment of a system that may include asymmetric circuitry.

This disclosure initially describes, with reference to FIGS. 1-2, an overview of an asymmetric circuit and an exemplary device. Exemplary embodiments of asymmetric circuits described in further detail with reference to FIGS. 3-8. In some embodiments, the techniques disclosed herein may increase performance and reduce power consumption in circuits when a circuit input is maintained as a constant over a time interval.

Referring now to FIG. 1, a block diagram illustrating one embodiment of a circuit 100 is shown. In the illustrated embodiment, circuit 100 includes asymmetric circuit 110 and storage element 120. In various embodiments, asymmetric circuit 110 may be configured asymmetrically with respect to its inputs in order to increase the speed and/or reduce the power consumption of circuit 100.

Storage element 120, in the illustrated embodiment, is configured to maintain programmable constant value 150 over a given time interval. Said another way, circuit 100 is configured to ensure that programmable constant value 150 does not change over the given time interval. Storage element 120 may be a software register, for example, and may be configured such that software cannot change the value stored during the given time interval. For example, storage element 120 may be configured to never change while asymmetric circuit 110 is operating, only changing when asymmetric circuit 110 is not currently operating. The time interval may correspond to a frame of video data in some embodiments, e.g., when storage element 120 is configured to store a filter coefficient. Thus, the term "constant" as used herein does not imply that a value never changes, but simply that the value does not change relative to some time period, fixed number of operations, fixed amount of data, etc. Also, programmable constant 150 is different than a constant or hardwired input, e.g., because it can change. Active input 130, in various embodiments, may take on multiple values during operations using a single value of programmable constant value 150. Based on the knowledge that programmable constant value will not change often, relative to active input 130, asymmetric circuit 110 may be improved relative to symmetric circuitry configured to perform the same operation.

Asymmetric circuit 110, in the illustrated embodiment, is configured to receive programmable constant value 150 and active input 130, perform an operation based on the inputs, and generate output 140. Asymmetric circuit 110 may be configured to perform various operations such as arithmetic operations, logical operations, instruction processing operations, etc. In particular exemplary embodiments discussed below, asymmetric circuit 110 is a multiplier, a multiplexer (MUX), or an exclusive-or (XOR) circuit. However, these embodiments are exemplary only and are not intended to limit the functionality of asymmetric circuit 110.

As used herein, the term "asymmetric circuit" refers to circuitry that is at least one of "leakage power asymmetric" and "critical path asymmetric" as those terms are defined below. Generally, these types of asymmetry are defined with reference to different ones of a plurality of inputs to a circuit. In this discussion, two inputs A and B may be used for exemplary purposes, but asymmetric circuitry may be implemented with any number of inputs.

A circuit is "critical path asymmetric" if it is configured such that the critical path between a first input and an output of the circuit is at least one and a half times greater in time than the critical path between a second input and the output. A critical path corresponds to the minimum time between a change in an input a circuit and a point in time at which the output of the circuit is valid based on the input. Critical path asymmetry may or may not be related to leakage power asymmetry. For example, critical path asymmetry may be caused by circuit design (e.g., input B may drive a path that includes more components than any path driven by input A, resulting in a longer critical path even when the components have the same leakage characteristics). Some types of circuits may be critical path asymmetric by their nature, but the critical path asymmetry of such circuits may be increased or changed (e.g., such that another input has a longest critical path for the circuit) by encoding one of the inputs, thereby increasing the critical path for that input and often allowing decreased critical paths for other inputs.

A circuit is "leakage power asymmetric" if it includes a first portion with a first set of one or more inputs that uses circuit elements (e.g., transistors, etc.) with lower leakage power consumption than circuit elements of a second portion of the circuit with a second set of one or more inputs. For example, input A may be used to drive high-speed transistors with high leakage power while input B may be used to drive lower-speed transistors with lower leakage power. Note that some portions of leakage power asymmetric circuitry may be driven by both input A and input B, so long as other portions are driven by only input A or input B and have different leakage power characteristics. For various transistor circuitry, a circuit is considered to be leakage power asymmetric if transistors driven by a first input have a nominal threshold voltage that is at least 30% higher than the threshold voltage of transistors driven by a second input.

"Leakage power" is power that is consumed simply because a circuit is on. This is in contrast to dynamic power, which is consumed (for digital circuitry) when changing logic states. Leakage power in metal-oxide semiconductor (MOS) transistors may include reverse biased diode leakage (related to parasitic diodes formed between diffusion region and substrate), gate induced drain leakage (current flowing between drain and substrate), gate-oxide tunneling, sub-threshold leakage (related to the weak inversion effect, drain-induced barrier lowering, and direct punch-through of electrons between drain and source), etc. Lowering the threshold voltage of transistors generally increases all of these effects (typically exponentially) and thus increases leakage power, but may increase computation speed. In contrast, transistors with a high threshold voltage may reduce computation speed but can greatly reduce leakage power. Various transistors described herein are MOS transistors, but similar techniques may be implemented using various field effect transistors as well as other transistors technologies such as bipolar junction transistors, for example.

A circuit may also be described as "area asymmetric." Area symmetric circuits may or may not be leakage power asymmetric or critical path asymmetric. A circuit is "area asymmetric" if a given input drives at least one and a half times the amount of circuitry as another input. For example, input A may drive 20 transistors while input B may drive only 10 transistors. Some circuits may be naturally area asymmetric, e.g., based on their function. However, designing functionally symmetric circuits (such as NAND gates or XOR gates, for example) to be area asymmetric may reduce power consumption in some embodiments. Circuitry that is area asymmetric may have low dynamic power consumption when the area of circuitry driven by a dynamic/active input is small reducing the amount of toggle activity. Speaking generally, reducing circuitry driven by an active input reduces toggle activity and dynamic power consumption.

Referring now to FIG. 2, a block diagram illustrating an exemplary embodiment of a device 200 is shown. In some embodiments, elements of device 200 may be included within a system on a chip. In some embodiments, device 200 may be included in a mobile device, which may be battery-powered. Therefore, power consumption by device 200 may be an important design consideration. In the illustrated embodiment, device 200 includes fabric 210, compute complex 220, input/output (I/O) bridge 250, cache/memory controller 245, graphics unit 260, display unit 265, and data processing unit 270.

Fabric 210 may include various interconnects, buses, MUX's, controllers, etc., and may be configured to facilitate communication between various elements of device 200. In some embodiments, portions of fabric 210 may be configured to implement various different communication protocols. In other embodiments, fabric 210 may implement a single communication protocol and elements coupled to fabric 210 may convert from the single communication protocol to other communication protocols internally.

In the illustrated embodiment, compute complex 220 includes bus interface unit (BIU) 225, cache 230, and cores 235 and 240. In various embodiments, compute complex 220 may include various numbers of cores and/or caches. For example, compute complex 220 may include 1, 2, or 4 processor cores, or any other suitable number. In one embodiment, cache 230 is a set associative L2 cache. In some embodiments, cores 235 and/or 240 may include internal instruction and/or data caches. In some embodiments, a coherency unit (not shown) in fabric 210, cache 230, or elsewhere in device 200 may be configured to maintain coherency between various caches of device 200. BIU 225 may be configured to manage communication between compute complex 220 and other elements of device 200. Processor cores such as cores 235 and 240 may be configured to execute instructions of a particular instruction set architecture (ISA) which may include operating system instructions and user application instructions.

Cache/memory controller 245 may be configured to manage transfer of data between fabric 210 and one or more caches and/or memories. For example, cache/memory controller 245 may be coupled to an L3 cache, which may in turn be coupled to a system memory. In other embodiments, cache/memory controller 245 may be directly coupled to a memory. In some embodiments, cache/memory controller 245 may include one or more internal caches.

As used herein, the term "coupled to" may indicate one or more connections between elements, and a coupling may include intervening elements. For example, in FIG. 2, graphics unit 260 may be described as "coupled to" a memory through fabric 210 and cache/memory controller 245. In contrast, in the illustrated embodiment of FIG. 2, graphics unit 260 is "directly coupled" to fabric 210 because there are no intervening elements.

Graphics unit 260 may be configured as described above with reference to FIGS. 1B, 2, and 3. Graphics unit 260 may include one or more processors and/or one or more graphics processing units (GPU's). Graphics unit 260 may receive graphics-oriented instructions, such OPENGL® or DIRECTED® instructions, for example. Graphics unit 260 may execute specialized GPU instructions or perform other operations based on the received graphics-oriented instructions. Graphics unit 260 may generally be configured to process large blocks of data in parallel and may build images in a frame buffer for output to a display. Graphics unit 260 may include transform, lighting, triangle, and/or rendering engines in one or more graphics processing pipelines. Graphics unit 260 may output pixel information for display images. In some embodiments, graphics unit 260 may include a programmable shader core configured to perform both vertex and pixel processing.

Data processing unit 270 may be configured to process various types of data, e.g., in conjunction with other elements of device 200. For example, data processing unit 270 may be configured to perform generic image processing, video processing, or communications data processing. Data processing unit 270, in some embodiments may include asymmetric circuitry. This circuitry may be used for processing images, frames of video, frames of communications data, and/or various other data blocks.

Display unit 265 may be configured to read data from a frame buffer and provide a stream of pixel values for display. Display unit 265 may be configured as a display pipeline in some embodiments. Additionally, display unit 265 may be configured to blend multiple frames to produce an output frame. Further, display unit 265 may include one or more interfaces (e.g., MIPI® or embedded display port (eDP)) for coupling to a user display (e.g., a touchscreen or an external display).

I/O bridge 250 may include various elements configured to implement: universal serial bus (USB) communications, security, audio, and/or low-power always-on functionality, for example. I/O bridge 250 may also include interfaces such as pulse-width modulation (PWM), general-purpose input/output (GPIO), serial peripheral interface (SPI), and/or inter-integrated circuit (I2C), for example. Various types of peripherals and devices may be coupled to device 200 via I/O bridge 250.

Peripheral unit 255, in some embodiments, may be coupled to various internal or external peripherals such as one or more cameras, for example. In some embodiments, peripheral unit 255 may include an image signal processor which may be configured to perform various operations on image and/or video data. In some embodiments, the image signal processor includes asymmetrical circuitry as described herein. In other embodiments, asymmetrical circuitry may be included in various elements of device 200 including, for example, graphics unit 260, display unit 265, and/or various additional elements that are not shown in FIG. 2.

Referring now to FIG. 3A, a block diagram illustrating one embodiment of a multiplier 300 is shown. In the illustrated embodiment, multiplier 300 includes partial product selection 305, adder array 310, radix encoder 320, and booth encoder 325.

Booth encoder 325, in the illustrated embodiment, is configured to encode multiplicand 340 and provide the result to partial product selection 305.

Radix encoder 320, in the illustrated embodiment, is configured to encode multiplier 330 using radix encoding (e.g., radix-4, which may involve multiplying multiplier 330 by 0, 1, 2, and 3) and provide the resulting partial products to partial product selection 305.

Partial product selection 305, in the illustrated embodiment, is configured to select from among the partial products based on the input from booth encoder 325 and provide the selected partial products to adder array 310.

Adder array 310, in the illustrated embodiment, is configured to add the selected partial products to produce multiplication result 345.

Multiplier 300, in the illustrated embodiment, may be designed to be substantially symmetric. For example, a critical path from multiplier 330 to result 345 may be similar in length to a critical path from multiplicand 340 to result 345. Further, the types of transistors driven by multiplier 330 and multiplicand 340 may be the same or may have similar leakage power characteristics. Thus, multiplier 300 may not be an asymmetric circuit.

Referring now to FIG. 3B, a block diagram illustrating one embodiment of an asymmetric multiplier 350 is shown. In the illustrated embodiment, multiplier 350 includes partial product selection 355, adder array 360, and high-order radix encoder 370.

High-order radix encoder 370, in the illustrated embodiment, is configured to encode programmable constant value 380 using radix-8, radix-16, or some other high-order radix encoding. High-order radix encoding may be time consuming in comparison to radix-4, for example, because some partial products (such as multiplication by 5 and 7) take more time to generate. However, because programmable constant value 380 is guaranteed to be constant for a given time interval, high-order radix encoding may be efficient overall, because the resulting partial products may be used for many multiplication operations (e.g., for multiple values of active input 390). Active input 390, in the illustrated embodiment, is not encoded, but is provided directly to partial product selection 355.

Partial product selection 355, in the illustrated embodiment, is configured to select from partial products generated by high-order radix encoder 370 based on active input 390 (which is not encoded in the illustrated embodiment) and pass the selected partial products to adder array 360.

Adder array 360, in the illustrated embodiment, is configured to add the selected partial products to produce multiplication result 395. In comparison to adder array 310 of multiplier 300, adder array 360 may include significantly less circuitry because the number of partial products may be smaller as a result of the high-order encoding. This may significantly reduce dynamic power consumption by adder array 360 in comparison to adder array 310, for example.

Further, in some embodiments, multiplier 350 is critical path asymmetric because the critical path for active input 390 is significantly shorter than the critical path for programmable constant value 380. For example, the critical path for a multiplier with radix-8 encoding may include circuitry for only N/3 additions while the critical path for a multiplier with radix-4 encoding may include circuitry from N/2 additions (where N is the number of bits in the multiplier and multiplicand). Further, in some embodiments, the circuitry in high-order radix encoder 370 includes using low-leakage circuitry (e.g., transistors with a high threshold voltage) relative to circuitry in partial product selection 355, so multiplier 350 may be leakage power asymmetric. In the illustrated embodiments, the radix encoding does not affect dynamic power consumption or the critical path of multiplier 350.

In various embodiments, multiplier 350 may achieve increased performance and/or lower power consumption overall in comparison with multiplier 300. These advantages may be the result of one or more of: lower-leakage circuitry used in encoding, a shorter critical path for the active input, and reduced circuitry in the adder array.

In other embodiments, various types of encoding may be performed in place of and/or in addition to radix encoding. The particular types of encoding of FIGS. 3A-3B are included for exemplary purposes and are not intended to be limiting.

Figure 4B:
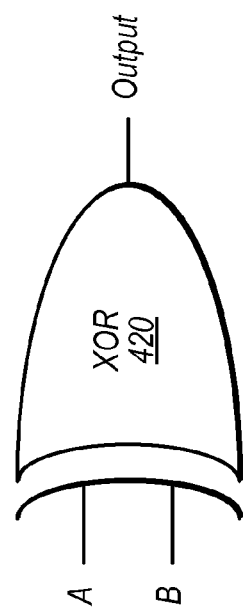
FIGS. 4A-4B illustrate exemplary generic MUX and XOR circuits.
Figure 4A:
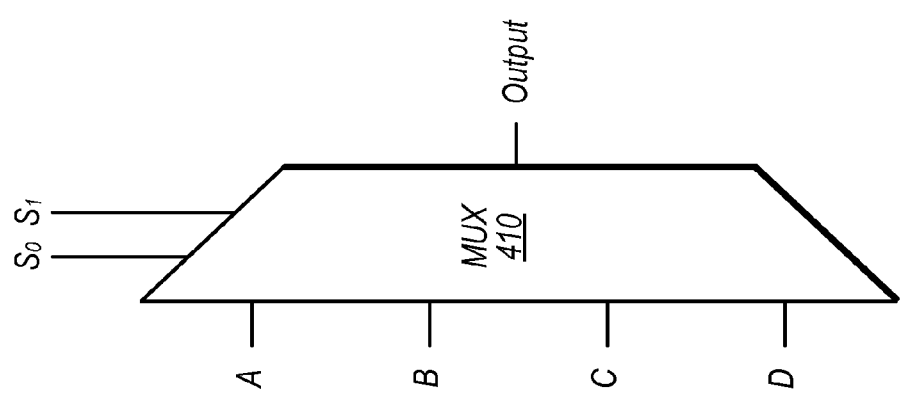

Referring now to FIGS. 4A-4B, diagrams illustrating embodiments of a MUX 410 and an XOR circuit 420 are shown. These elements may be implemented using asymmetric circuitry as described in further detail below with reference to FIGS. 6A-6B and 7B.

Figure 6B:
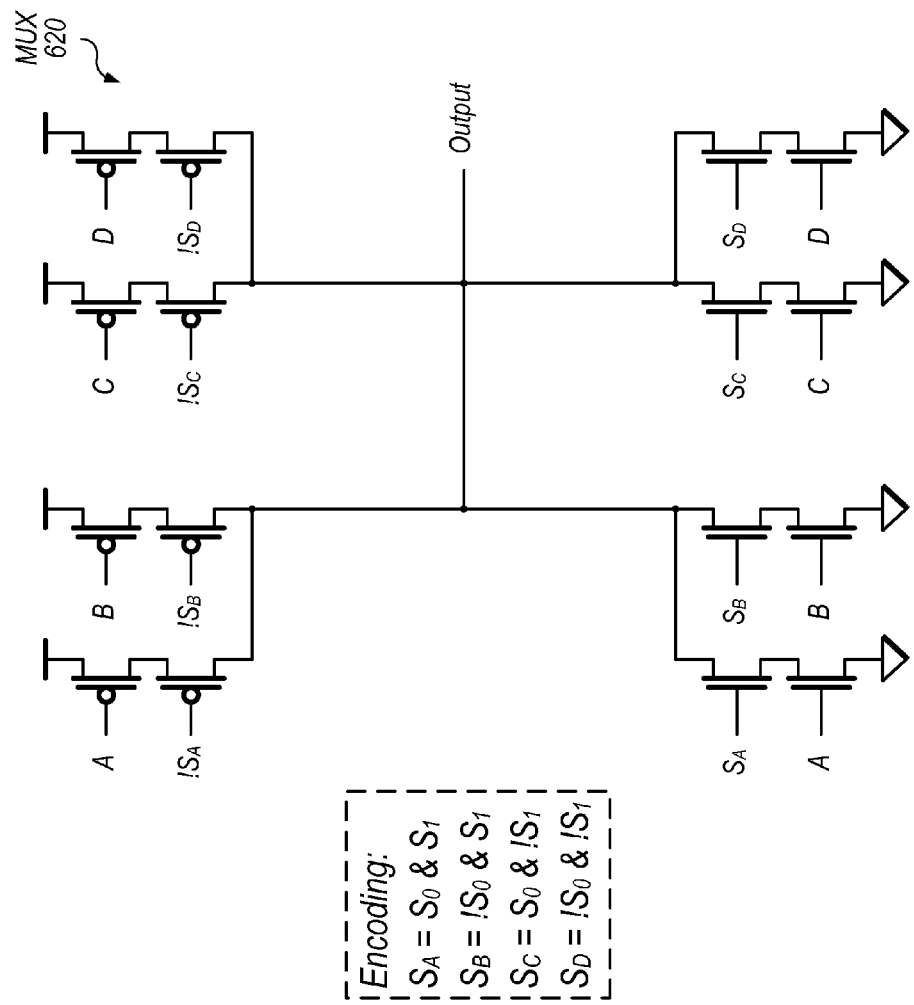
Figure 6A:
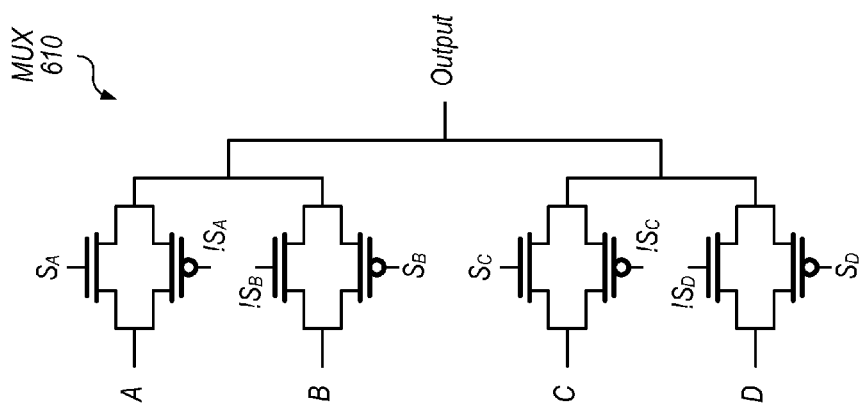

MUX 410, in the illustrated embodiment, is a four-to-one MUX configured to select one of inputs A-D based on select bits $S_0$ and $S_1$. In other embodiments, MUXs of various sizes (e.g., having various numbers of select bits) may be implemented using similar techniques. In the embodiments of FIGS. 6A-6B, MUX 410 is implemented using asymmetric circuitry for a select signal that is a programmable constant.

Figure 7B:
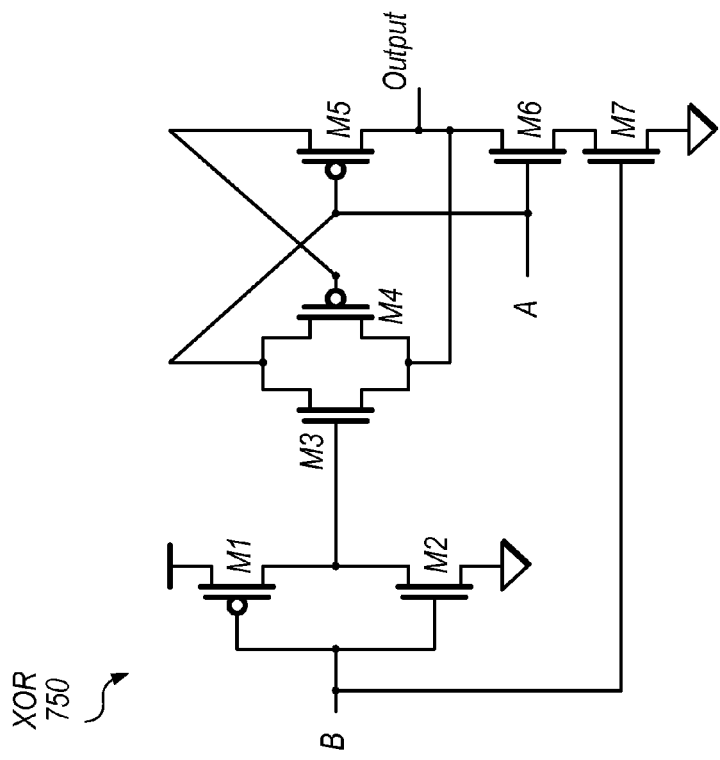
FIGS. 7A-7B illustrate exemplary embodiments of XOR circuits.

XOR circuit 420, in the illustrated embodiment, is configured to generate an output based on inputs A and B. XOR circuit 420 is configured to generate a true output (e.g., a high voltage or a '1') when an odd number of inputs to XOR circuit 420 are true. In the illustrated embodiment, XOR circuit 420 is a two-input circuit, but in other embodiments, XOR circuits having larger numbers of inputs may be implemented using similar techniques. In the embodiment of FIG. 7B, XOR 420 is implemented using asymmetric circuitry for one input that is a programmable constant.

Figure 5B:
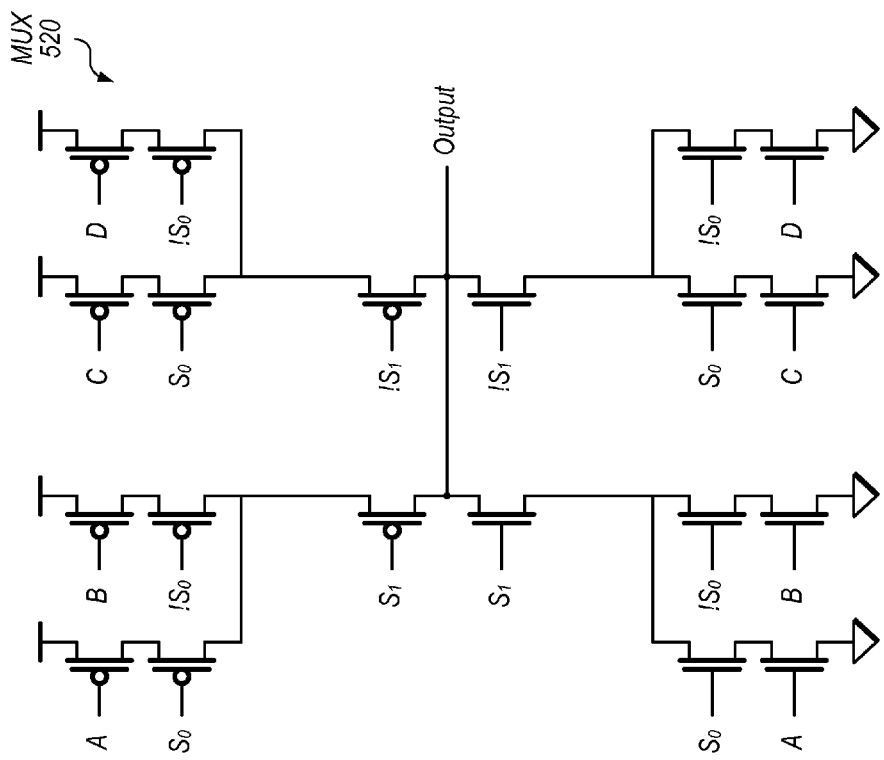
FIGS. 5A-6B illustrate exemplary embodiments of MUX circuits.
Figure 5A:
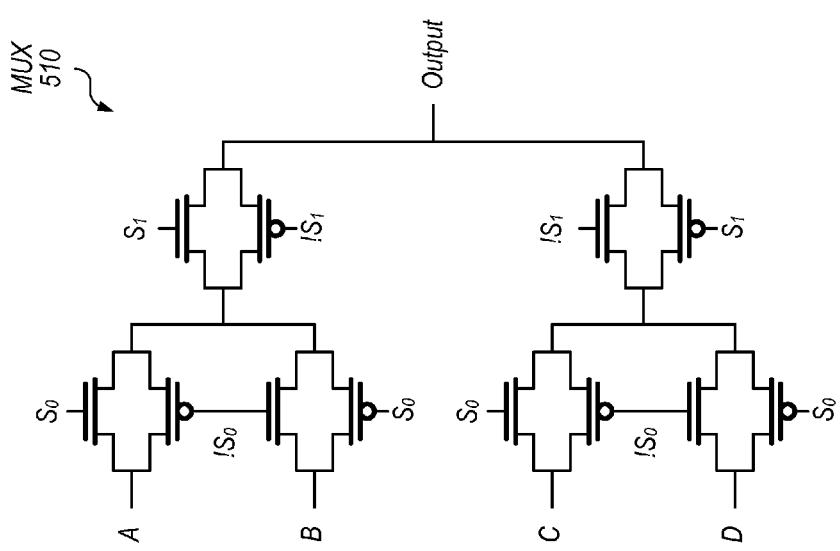

Referring now to FIGS. 5A-5B, diagrams illustrating exemplary embodiments of MUXs 510 and 520 are shown. Both MUXs are four-to-one MUXs with four inputs A-D and two select bits $S_0$ and $S_1$. In the illustrated embodiment, MUX 510 is pass transistor implementation while MUX 520 is a CMOS implementation. Each implementation includes twelve transistors that are controlled by the select signal (which also drives two inverters, not shown). In the illustrated embodiment, $!S_0$ represents the inverse of $S_0$ and $!S_1$ represents in the inverse of $S_1$. If the select signal is constant or programmable constant, MUXs 510 and 520 may be improved as shown in FIGS. 6A-6B.

Referring now to FIGS. 6A-6B, diagrams illustrating exemplary embodiments of asymmetric MUX circuits 610 and 620 are shown. As in FIG. 5, both MUXs are four-to-one MUXs with four inputs A-D and two select bits $S_0$ and $S_1$. In the illustrated embodiment, MUX 610 is pass transistor implementation while MUX 620 is a CMOS implementation. In the illustrated embodiment, the select bits are one-hot encoded using circuitry that is not shown (e.g., AND gates) to generate select signals $S_A$-$S_D$. In the embodiments of FIG. 6, inputs A, B, C, and D each travel through one less transistor before reaching the output, relative to the embodiments of FIG. 5. This may result in lower delay and dynamic power consumption relative to the embodiments of FIG. 5. For example, relative to the circuits of FIG. 5, the circuits in the illustrated embodiments of FIG. 6 may have a critical path that is ⅔ of the length and consume ⅔ the amount of dynamic power.

In some embodiments, because the transistors driven by the select signals $S_A$-$S_D$ will not be switching often, a high threshold voltage can be used for those transistors, further reducing power consumption. In these embodiments, MUX 620 is leakage power asymmetric. In some embodiments, low-leakage circuitry is also used in encoding select signals $S_A$-$S_D$. Because of the encoding, MUXs 610 and 620 are typically critical path asymmetric. This may increase performance in various embodiments by reducing the critical path of the inputs A-D, because the critical path of the select signal is relatively unimportant if the select signal is programmable constant.

The exemplary circuit layouts and transistor types shown in FIGS. 6A-6B are not intended to be limiting; other asymmetrical layouts and transistor topologies are contemplated.

Figure 7A:
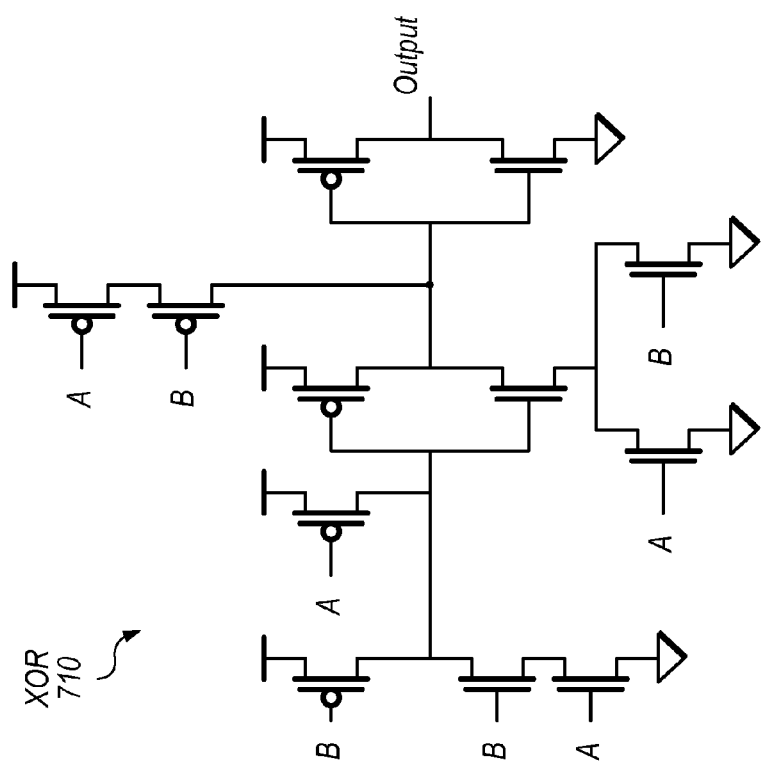

Referring now to FIG. 7A, a diagram illustrating one embodiment of an XOR circuit 710 is shown. In the illustrated embodiment, each input (A or B) drives four transistors directly, typically resulting in the same power and delay with respect to each input. XOR circuit 710 may be naturally symmetrical in the illustrated embodiment.

Referring now to FIG. 7B, a diagram illustrating one embodiment of an asymmetrical XOR circuit 750 is shown. In this embodiment, the input B is programmable constant. In this embodiment, the input B is coupled to drive six transistors (including four gate terminals) while the active input A is coupled to drive four transistors (including only two gate terminals). XOR circuit 750 may not be the smallest achievable XOR circuit in terms of number of transistors, but it is highly asymmetric. This may result in a shorter critical path for the active input A, which may in turn result in increased performance relative to the embodiment of FIG. 7A. This may also reduce active power consumption. In some embodiments, transistors M1, M2, and M7 may have a high threshold voltage relative to the remaining transistors in order to reduce leakage power. This may result in reduced power consumption relative to the embodiment of FIG. 7A.

The exemplary circuit layout and transistor types shown in FIG. 7B are not intended to be limiting; other asymmetrical layouts and transistor topologies are contemplated. In other embodiments, other types of asymmetric circuits are contemplated in addition to and/or in place of the exemplary multiplier, MUX, and XOR circuits discussed herein.

Figure 8:
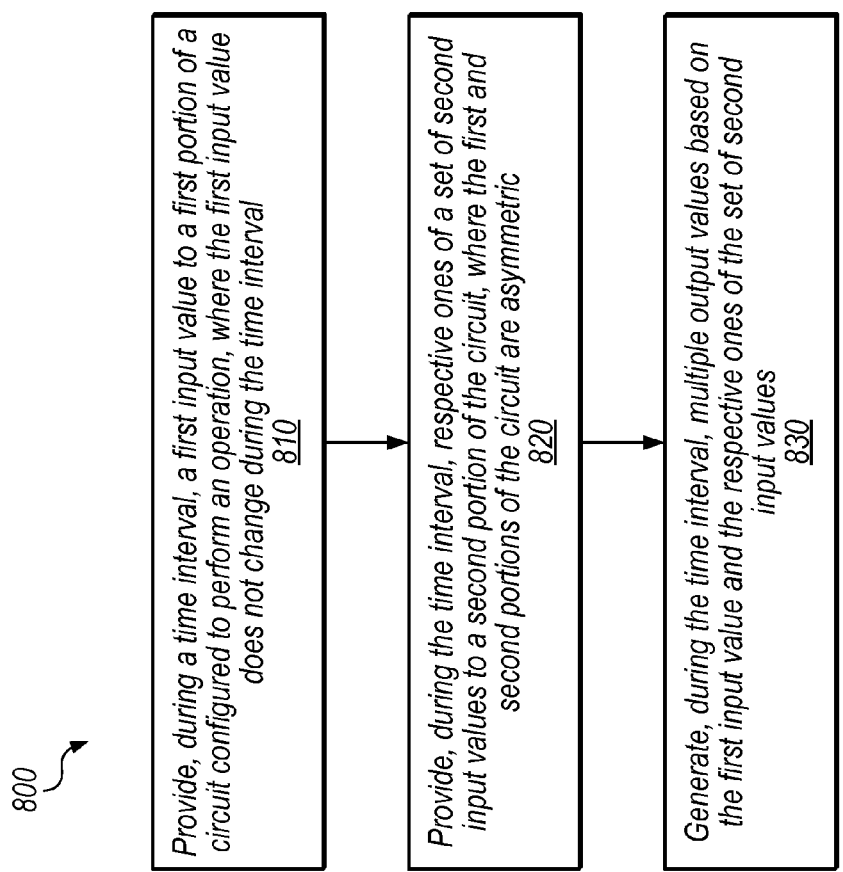
FIG. 8 is a flow diagram illustrating one embodiment of a method for operating asymmetric circuitry.

Referring now to FIG. 8, a flow diagram illustrating one exemplary embodiment of a method 800 using asymmetric circuitry is shown. The method shown in FIG. 8 may be used in conjunction with any of the computer systems, devices, elements, or components disclosed herein, among other devices. In various embodiments, some of the method elements shown may be performed concurrently, in a different order than shown, or may be omitted. Additional method elements may also be performed as desired. Flow begins at block 810.

At block 810, a first input value is provided (e.g., by storage element 120) to a first portion of a circuit. In the illustrated embodiment, the first input value does not change during the time interval. The time interval may corresponding to processing performed for a frame of video data or wireless communication data, for example. Flow proceeds to block 820.

At block 820, respective ones of a set of second input values are provided to a second portion of the circuit. In the illustrated embodiment, the first and second portions of the circuit are asymmetric. In some embodiments, the first and second portions are both leakage power asymmetric and critical path asymmetric. In some embodiments, the first input value may be held constant while performing operations using a large number of second input values. Flow proceeds to block 830.

At block 830, multiple output values are generated (e.g., by multiplier 350, MUX 610, MUX 620, or XOR circuit 750 in some embodiments) during the time interval, based on the first input value and the respective ones of the set of second input values. Flow ends at block 830.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    an asymmetric circuit configured to generate, during a time interval, a plurality of output values, each at a different time during the interval, based on a first input value and respective ones of a set of second input values, wherein the respective ones of the set of second input values are input to the asymmetric circuit at different times during the time interval; and
    a storage element configured to maintain the first input value as an input to the asymmetric circuit during the time interval;
    wherein a first portion of the circuit that is driven by the first input value includes one or more transistors with a first threshold voltage and wherein a second portion of the circuit that is driven by the set of second input values includes one or more transistors with a second threshold voltage that is lower than the first threshold voltage.

2. The apparatus of claim 1, wherein the storage element is programmable to store the first input value for the entirety of a time interval corresponding to a frame of video data.

3. The apparatus of claim 1, wherein the asymmetric circuit is configured to encode the first input value and is not configured to encode any of the set of second input values.

4. The apparatus of claim 3, wherein the asymmetric circuit is configured to encode the first input value using at least one of: radix encoding and one-hot encoding.

5. The apparatus of claim 1, wherein the asymmetric circuit comprises a critical path for the first input value that is at least twice as long as a critical path for the set of second input values.

6. The apparatus of claim 1, wherein the asymmetric circuit includes at least one of: a multiplexor, an exclusive-or circuit, and a multiplier.

7. A method, comprising:
    providing, during a time interval, a first input value to a first portion of a circuit configured to perform an operation, wherein the first input value does not change during the time interval;
    providing, each at a different time during the time interval, respective ones of a set of second input values to a second portion of the circuit, wherein the first and second portions of the circuit are asymmetric; and
    generating, by the circuit at different times during the time interval, a plurality of output values based on the first input value and the respective ones of the set of second input values;
    wherein the first portion of the circuit includes one or more transistors with a first threshold voltage and wherein the second portion of the circuit includes one or more transistors with a second threshold voltage that is lower than the first threshold voltage.

8. The method of claim 7, further comprising:
    encoding the first input value but not encoding any of the set of second input values.

9. The method of claim 7, wherein the first portion of the circuit has a critical path that is longer than a critical path of the second portion of the circuit.

10. The method of claim 7, further comprising:
    providing the respective ones of the set of second input values to drive a smaller number of transistors of the circuit than the first input value.

11. The method of claim 7, wherein the circuit is configured to perform operations corresponding to at least one of: generating a frame of video and generating a frame of wireless communication data.

12. An apparatus, comprising:
    a circuit configured to generate, each at a different time during a time interval corresponding to a frame of video data, a plurality of output values for the frame of video data from a first input value and respective ones of a set of second input values, wherein the respective ones of the set of second input values are input to the circuit at different times during the time interval; and
    a storage element configured to provide the first input value to the circuit as a constant during the time interval;

wherein a critical path of the circuit for the first input value is at least one and a half times as long as a critical path of the circuit for the set of second input values; and wherein the circuit includes a first portion that includes one or more circuit elements having a lower leakage power and a second portion that includes one or more circuit elements having a higher leakage power, and wherein the first portion is driven by the first input value and the second portion is driven by the set of second input values.

13. The apparatus of claim 12, wherein the circuit comprises a multiplier, wherein the first portion of the circuit includes an encoder, and wherein the second portion of the circuit includes an adder array configured to add values generated by the encoder.

14. The apparatus of claim 13, wherein the encoder is configured to perform a radix-8 or higher encoding on the first input value and is wherein the circuit is not configured to encode any of the set of second input values.

15. The apparatus of claim 12, wherein the circuit comprises a multiplexer (MUX), wherein the first input value includes a plurality of select bits for the MUX, and wherein the set of second input values each include a plurality of MUX inputs.

16. The apparatus of claim 15, wherein a first portion of the circuit is configured to perform one-hot encoding on the plurality of select bits to generate a plurality of selection signals; and wherein a second portion of the circuit is configured to select from among the MUX inputs based on the plurality of selection signals.

17. The apparatus of claim 12, wherein the circuit comprises an exclusive-or (XOR) circuit.

18. The apparatus of claim 17, wherein the circuit includes seven transistors;

wherein the circuit is configured to drive four of the seven transistors using the first input value and to provide the first input value to the gate terminals of at most two of the seven transistors; and wherein the circuit is configured to drive six of the seven transistors using the set of second input values.

* * * * *